(12) United States Patent
Lee et al.

(10) Patent No.: US 11,031,517 B2
(45) Date of Patent: Jun. 8, 2021

(54) METHOD OF MANUFACTURING LIGHT TRANSMISSION TYPE COMPOUND THIN FILM, COMPOUND THIN FILM MANUFACTURED THEREFROM, AND SOLAR CELL INCLUDING THE SAME

(71) Applicant: KOREA INSTITUTE OF SCIENCE AND TECHNOLOGY, Seoul (KR)

(72) Inventors: Doh-Kwon Lee, Seoul (KR); Jangmi Lee, Seoul (KR); Inho Kim, Seoul (KR); Jeung-hyun Jeong, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 147 days.

(21) Appl. No.: 16/111,805

(22) Filed: Aug. 24, 2018

(65) Prior Publication Data

US 2019/0157481 A1 May 23, 2019

(30) Foreign Application Priority Data

Nov. 8, 2017 (KR) .................. 10-2017-0148121
Aug. 14, 2018 (KR) .................. 10-2018-0094927

(51) Int. Cl.
*H01L 31/0463* (2014.01)
*G03F 7/20* (2006.01)
(Continued)

(52) U.S. Cl.
CPC ...... *H01L 31/0463* (2014.12); *G03F 7/70625* (2013.01); *H01L 31/022433* (2013.01);
(Continued)

(58) Field of Classification Search
CPC ............. H01L 31/0463; H01L 31/0445; H01L 31/0322; H01L 31/1868; H01L 31/022433; G03F 7/70625; Y02E 10/541
See application file for complete search history.

(56) References Cited

U.S. PATENT DOCUMENTS

| | | | | |
|---|---|---|---|---|
| 5,985,125 A | * | 11/1999 | Kim ................. | H01L 21/2885 205/123 |
| 2014/0020736 A1 | * | 1/2014 | Lee .................. | H01L 31/18 136/252 |

FOREIGN PATENT DOCUMENTS

KR 10-0157889 B1 2/1999
KR 10-2007-0104021 A 10/2007
(Continued)

OTHER PUBLICATIONS

Korean Office Action dated Jul. 18, 2019.

*Primary Examiner* — Syed I Gheyas
(74) *Attorney, Agent, or Firm* — Rabin & Berdo, P.C.

(57) ABSTRACT

According to an aspect of the present invention, there is provided a method of manufacturing a compound thin film, which includes configuring an electrodeposition circuit by connecting an electrolytic solution, which is manufactured by mixing a predetermined precursor with a solvent, and an electrochemical cell, which includes a working electrode in a form of an electrode at which a specific pattern is patterned on a predetermined substrate, to a voltage application device or a current application device, and applying a reduction voltage or current to the working electrode using the voltage application device or the current application device, and selectively electrodepositing a thin film in some region of the electrode along a shape of the electrode at which the specific pattern is patterned.

14 Claims, 14 Drawing Sheets

(51) Int. Cl.
*H01L 31/18* (2006.01)
*H01L 31/0224* (2006.01)
*H01L 31/0445* (2014.01)
*H01L 31/032* (2006.01)

(52) U.S. Cl.
CPC ...... *H01L 31/0322* (2013.01); *H01L 31/0445* (2014.12); *H01L 31/1868* (2013.01)

(56) References Cited

FOREIGN PATENT DOCUMENTS

| | | |
|---|---|---|
| KR | 10-2010-0020756 A | 2/2010 |
| KR | 10-2010-0089898 A | 8/2010 |
| KR | 10-1044906 B1 | 6/2011 |
| KR | 10-1327536 B1 | 11/2013 |
| KR | 10-1644788 B1 | 8/2016 |

* cited by examiner $V_{OC}$ (V)         0.374
$J_{SC}$ (mA/cm²)    39.4
FF                   0.506
EFF. (%)             7.46
Area (cm²)           0.297

$V_{OC}$ (V)         0.411
$J_{SC}$ (mA/cm²)    38.4
FF                   0.590
EFF. (%)             9.31
Area (cm²)           0.327

METHOD OF MANUFACTURING LIGHT TRANSMISSION TYPE COMPOUND THIN FILM, COMPOUND THIN FILM MANUFACTURED THEREFROM, AND SOLAR CELL INCLUDING THE SAME

CROSS-REFERENCE TO RELATED APPLICATION

This application claims priorities to and the benefit of Korean Patent Applications No. 10-2018-0094927, filed on Aug. 14, 2018 and No. 10-2017-0148121, filed on Nov. 8, 2017 and the disclosures of which are incorporated herein by reference in its entirety.

BACKGROUND

1. Field of the Invention

The present invention relates to a technique for selectively forming a light absorption thin film layer only at a specific region of an electrode using electrochemical deposition and selective electrodeposition, and more particularly, to a method of manufacturing a light transmission type compound thin film having light transmittance, a light transmission type compound thin film manufactured therefrom, and a solar cell including the same.

2. Discussion of Related Art

As interest in environmental pollution problems and global warming due to greenhouse gases has increased along with Framework Convention on Climatic Change, interest in solar cells as eco-friendly renewable energy source is increasing. Solar cells are classified into silicon solar cells, compound thin film solar cells, and organic or hybrid solar cells according to a kind of light absorption layer.

Currently, the world solar cell market is dominated by silicon solar cells, but it is urgent to develop solar cells capable of being used in urban areas where buildings are concentrated in a restricted territorial environment as in Korea. The reason is that since silicon solar cells are heavy and opaque and have uniform and rough appearance unique to crystalline silicon, applications to buildings, automobiles, and portable electronic devices are extremely limited.

Meanwhile, interest and investment on a thin film solar cell, which is capable of having a lightweight and flexible form by being made of a thin film to dramatically expand the application field, are gradually increasing.

A compound-based thin film solar cell (hereinafter, referred to as a compound thin film solar cell), which is represented by copper indium selenide (CIS) ($CuInSe_2$), copper indium gallium selenide (CIGS) ($Cu(In_{1-x}Ga_x)Se_2$), or copper zinc tin sulfide (CZTS) ($Cu_2ZnSnS_4$)) has advantages of being capable of having a high photoelectric conversion efficiency comparable to a polycrystalline silicon solar cell and of being manufactured to be lightweight and flexible while having chemical, optically, and electrical stability in comparison to an organic-based solar cell. Therefore, such a compound thin film solar cell is attracting attention as a next-generation solar cell capable of expanding applications of solar cells to fields which cannot be implemented by silicon solar cells (e.g., the exterior of building, a curved surface type solar cell, and the like).

Meanwhile, when a light absorption layer is patterned to impart light transmittance to a thin film solar cell, a characteristic of a back contact, a light absorption thin film, or an interface between the back contact and the light absorption layer thin film is degraded at a cut surface of the back contact or the light absorption layer, which is formed as a result of the patterning, such that a shunt loss or a recombination loss may occur to cause degradation in efficiency of the thin film solar cell.

If light transmittance can be imparted to a compound thin film solar cell through a method preventing degradation in efficiency of the compound thin film solar cell, it is possible to manufacture a high added value solar cell which is excellent in terms of costs, efficiency (output), and stability while securing aesthetic impression, and it is expected that the utilization and added value of the compound thin film solar cell will be further enhanced.

SUMMARY OF THE INVENTION

The present invention is directed to a method of manufacturing a light transmission type compound thin film having light transmittance using electrochemical deposition (or electrodeposition) and selective electrodeposition.

Further, the present invention is directed to preventing a shunt loss and a recombination loss caused by exposure of a lateral surface or a cut surface of an electrode which is patterned for the purpose of manufacturing a light transmission type thin film solar cell.

In addition, in order to apply selective electrodeposition for manufacturing a light transmission type thin film solar cell, it is required to pattern a back contact of a thin film solar cell. However, a thickness of a light absorption thin film formed at a lateral surface or a cut surface of the back contact, which is formed as a result of the patterning of the back contact, may become thinner and quality of the light absorption thin film may be degraded. Consequently, the shunt loss may occur between a front transparent electrode and the back contact of the cut surface, and the recombination loss may increase in the light absorption layer or in an interface between the back contact of the cut surface and the light absorption layer. The present invention is provided to resolve the above-described problem of occurrence of the shunt loss and the recombination loss.

Furthermore, the present invention is directed to providing a solar cell including the above-described light transmission type compound thin film which prevents a loss of a light absorption layer material, which is generally caused by a process of removing a portion of the light absorption layer by a mechanical or laser processing after the light absorption layer is formed on an entire area of an electrode for imparting light transmittance to a thin film solar cell, and which secures light transmittance simultaneously with formation of the light absorption layer thin film.

Moreover, the present invention is directed to providing a solar cell including the above-described light transmission type compound thin film which is capable of being used to the exterior of building, a glass and a sunroof of a vehicle, a portable electronic device, and the like and to which light transmittance (daylighting) and aesthetic impression are added.

The technical problem to be solved by the present invention is not limited to the above-mentioned technical problems, and other technical problems which are not mentioned can be clearly understood by those skilled in the art to which the present invention pertains from the following description.

According to an aspect of the present invention, there is provided a method of manufacturing a compound thin film, which includes configuring an electrodeposition circuit by connecting an electrolytic solution, which is manufactured by mixing a predetermined precursor with a solvent, and an electrochemical cell, which includes a working electrode in a form of an electrode at which a specific pattern is patterned on a predetermined substrate, to a voltage application device or a current application device, and applying a reduction voltage or current to the working electrode using the voltage application device or the current application device, and selectively electrodepositing a thin film in some region of the electrode along a shape of the electrode at which the specific pattern is patterned.

The method may further include, before the configuring of the electrodeposition circuit, manufacturing an electrode substrate on which the electrode at which the specific pattern is patterned is formed, wherein the manufacturing of the electrode substrate may include forming the electrode on the predetermined substrate, forming the specific pattern using photolithography of forming a photoresist on the electrode, forming a passivation film in a predetermined region on the electrode, and removing the photoresist formed on the electrode.

The method may further include, before the configuring of the electrodeposition circuit, manufacturing an electrode substrate on which the electrode at which the specific pattern is patterned is formed, wherein the manufacturing of the electrode substrate may include forming the electrode on the predetermined substrate, forming the specific pattern on the electrode using a laser, and forming a passivation film in a predetermined region on the electrode.

One surface of the electrode at which the specific pattern is patterned may be a lateral surface of the electrode at which the specific pattern is patterned or may be a cut surface generated as the specific pattern is patterned on the electrode.

The method may further include performing heat treatment on the thin film formed in the forming of the thin film in a selenium or sulfur-containing gas atmosphere.

The specific pattern may be in the form of one or more circular or polygonal hollow-hole patterns.

The predetermined substrate may be formed of a soda-lime glass, and the electrode at which the specific pattern is patterned may be formed of molybdenum (Mo).

The electrolytic solution may be produced by dissolving one or more among potassium chloride, sulfamic acid, potassium hydrogenphthalate, selenium dioxide, copper chloride dehydrate, and indium chloride in distilled water to have a predetermined pH.

The passivation film may be formed of one among an oxide, a nitride, and a sulfide made of one metal among nickel, tungsten, molybdenum, copper, titanium, zinc, tin, iron, chromium, aluminum, silicon, and magnesium, or an alloy of two or more among nickel, tungsten, molybdenum, copper, titanium, zinc, tin, iron, chromium, aluminum, silicon, and magnesium, and the forming of the passivation film in the predetermined region on the electrode may be performed using a coating method including sputtering, thermal evaporation, e-beam evaporation, atomic layer deposition, spin coating, doctor blading, electro-spraying, or electrodeposition.

According to another aspect of the present invention, there is provided a compound thin film manufactured by the above-described method of manufacturing a compound thin film.

According to still another aspect of the present invention, there is provided a solar cell comprising the above-described compound thin film.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
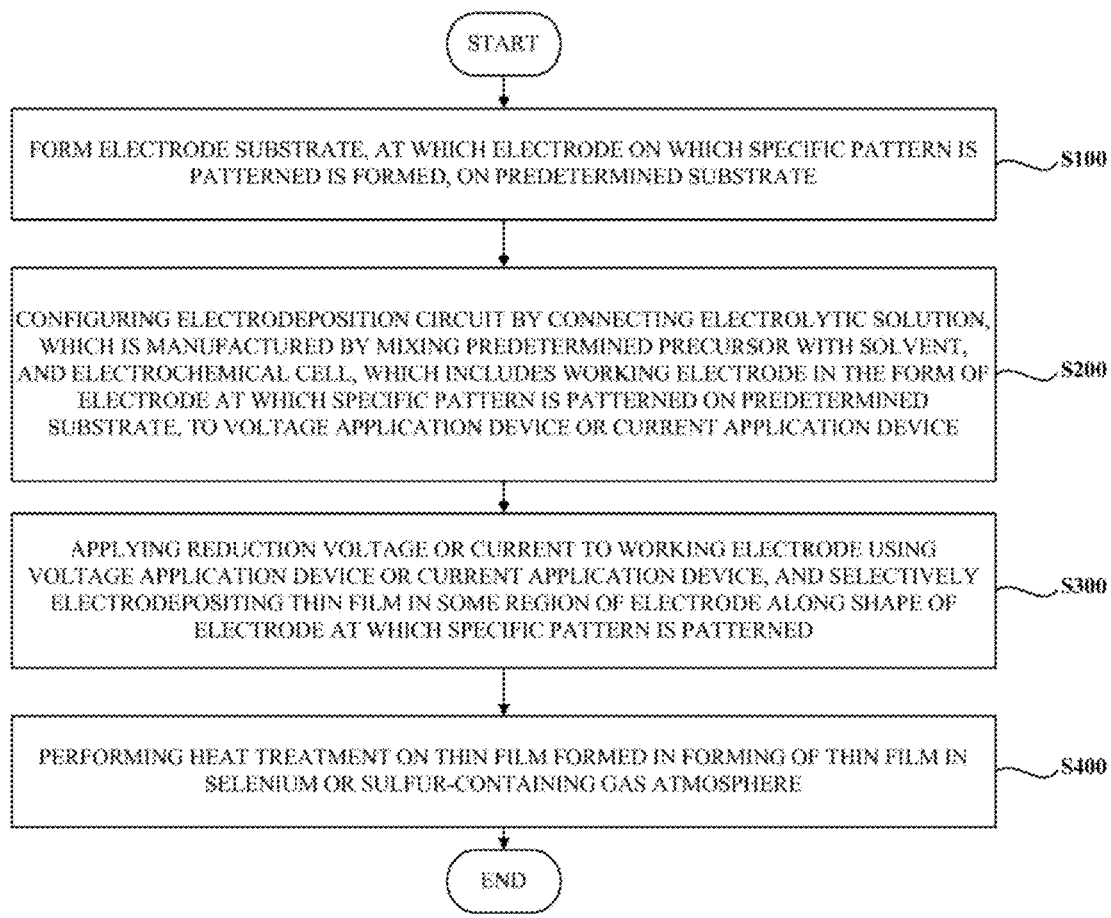
FIG. 1 is a flowchart illustrating a method of manufacturing a compound thin film according to one embodiment of the present invention.

Hereinafter, embodiments of the present invention will be described in detail with reference to the accompanying drawings. The present invention may be implemented in various different forms, and thus it is not limited to embodiments which will be described herein. Further, the accompanying drawings are merely intended to facilitate understand of embodiments disclosed herein, and the technical spirit disclosed herein is not limited by the accompanying drawings, and it should be understood that all modifications, equivalents, and substitutes fall within the spirit and scope of the present invention. In order to clearly describe the embodiments of the present invention, portions not related to the description are omitted, and a size, a form, and a shape of each component shown in the drawings may be variously modified, and throughout this disclosure, the same and similar reference numerals are assigned to the same and similar parts.

Terms "operation" and "process" for components used in the following description are given or interchanged in consideration of only ease of description, and thus these terms do not have distinctive meanings or functions. Further, in the following description of embodiments disclosed herein, when a detailed description of a known related art is determined to obscure the gist of the embodiments disclosed herein, the detailed description thereof will be omitted.

Throughout this disclosure, when a part is referred to as being "connected (jointed, contacted, or coupled)" to another part, this includes a case in which the part is "directly connected (jointed, contacted, or coupled)" to another part as well as a case in which the part is "indirectly connected (jointed, contacted, or coupled)" to another part by interposing yet another member between the part and another part. Further, when a part is referred to as "including (having or providing with)" a component, this refers that the part can further include another elements, not excluding another elements unless specifically stated otherwise.

The terms used herein are for the purpose of describing only specific embodiments and are not intended to limit the present invention. The singular form includes the plural form unless the context clearly dictates otherwise, and components which are distributed and implemented may be embodied in a combined form unless otherwise specified. In this disclosure, the terms "comprising," "having," or the like are used to specify that a feature, a number, a step, an operation, a component, an element, or a combination thereof described herein exists, and they do not preclude the presence or addition of one or more other features, numbers, steps, operations, components, elements, or combinations thereof.

Figure 2:
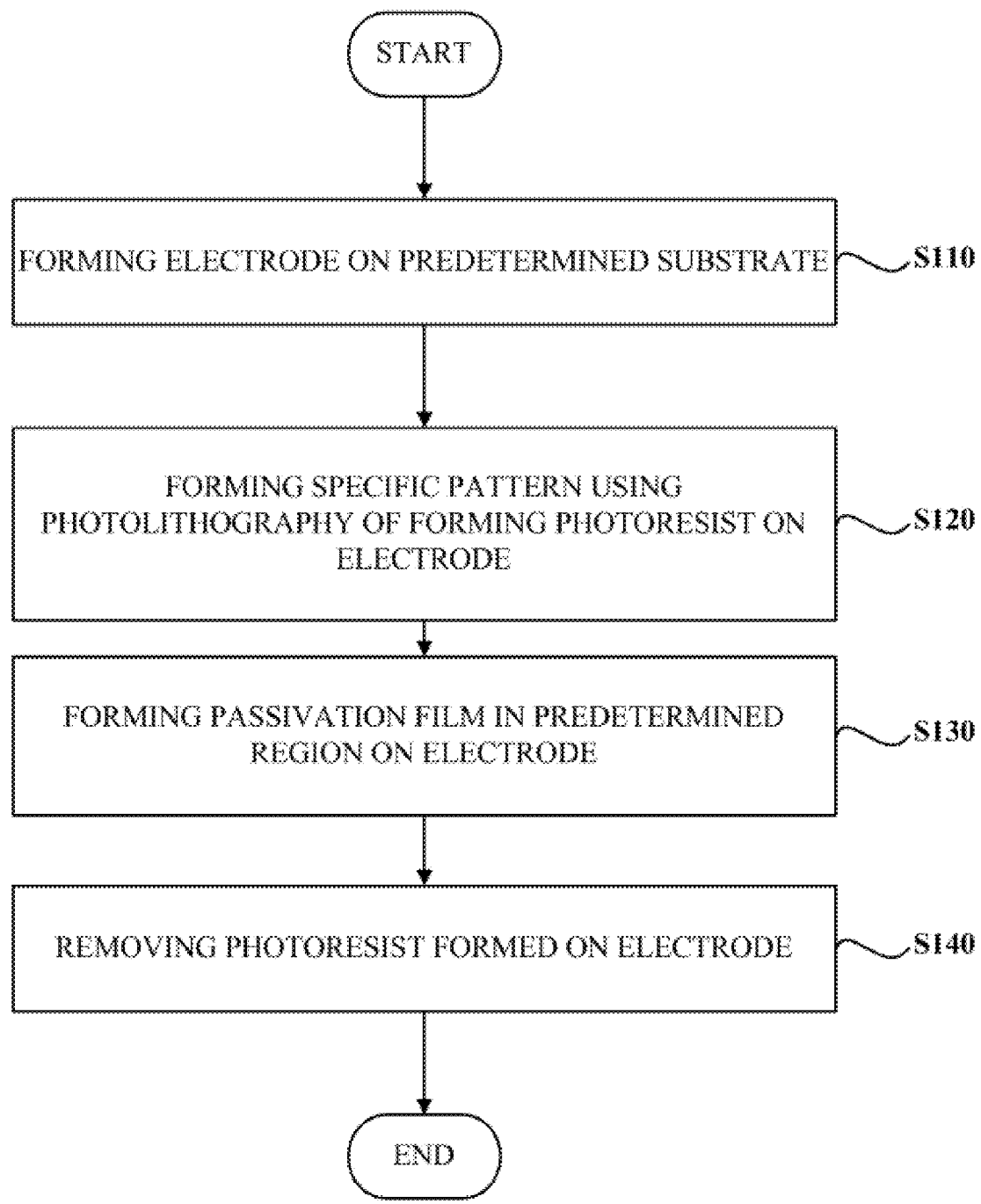
FIGS. 2 and 3 are flowcharts illustrating a detailed process of generating an electrode substrate according to one embodiment of the present invention.
Figure 3:
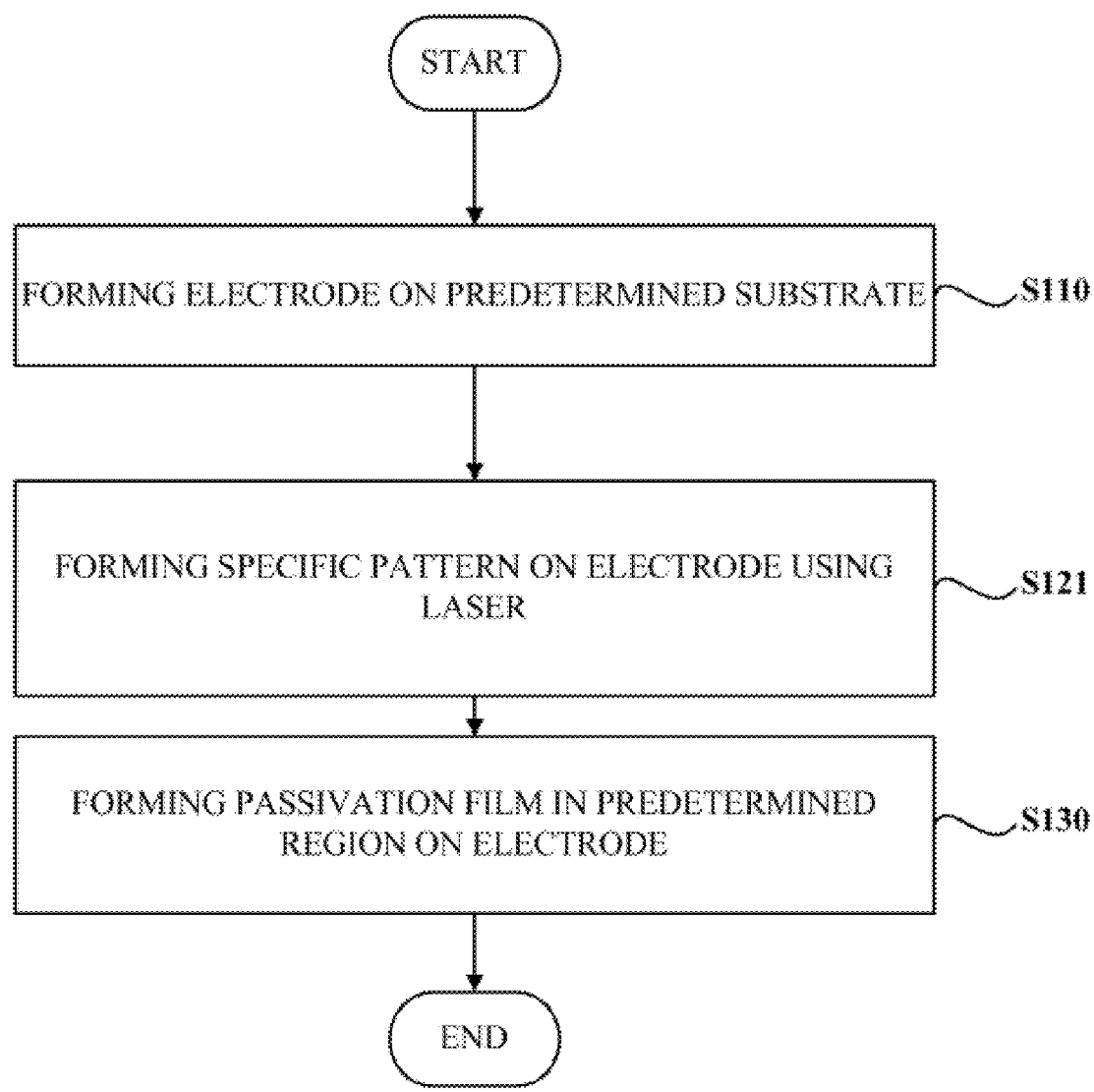
Figure 4:
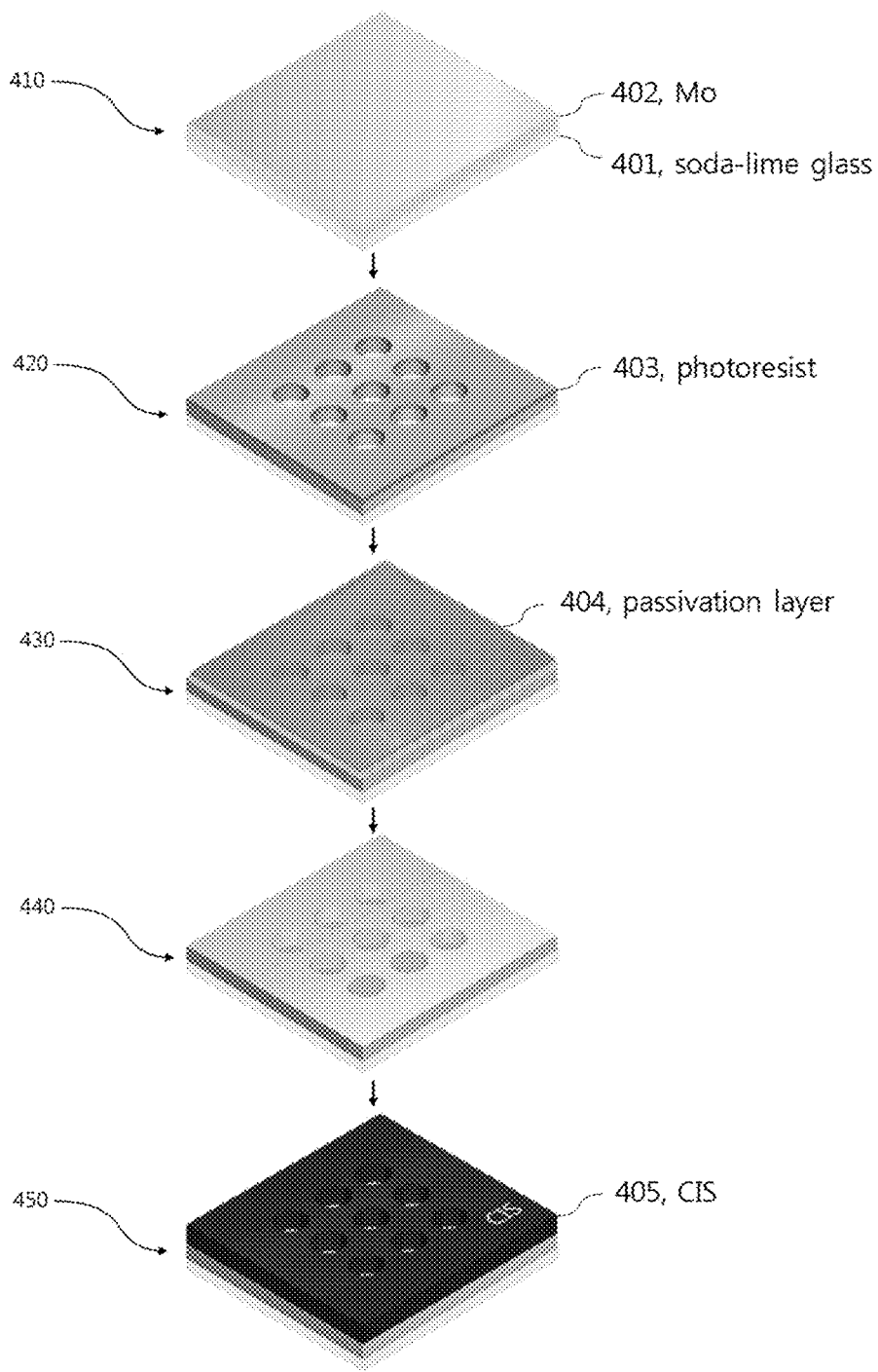
FIG. 4 is a schematic diagram illustrating a portion of processes in the method of manufacturing a compound thin film according to one embodiment of the present invention.

FIG. 1 is a flowchart illustrating a method of manufacturing a compound thin film according to one embodiment of the present invention (hereinafter, referred to as a "method 1 of manufacturing a compound thin film"), FIGS. 2 and 3 are flowcharts illustrating a detailed process of an operation S100 of forming an electrode substrate according to one embodiment of the present invention, and FIG. 4 is a schematic diagram illustrating a portion of processes in the method 1 of manufacturing a compound thin film according to one embodiment of the present invention.

The method 1 for manufacturing a compound thin film includes an operation S200 of configuring an electrodeposition circuit using an electrodeposition circuit 100 using an electrochemical cell, and an operation S300 of forming a compound thin film.

The operation S200 of configuring the electrodeposition circuit refers to an operation of configuring an electrodeposition circuit by connecting an electrolytic solution, which is manufactured by mixing a predetermined precursor with a solvent, and an electrochemical cell, which includes a working electrode in the form of an electrode at which a specific pattern is patterned on a predetermined substrate, to a voltage application device or a current application device.

The operation S300 of forming the compound thin film refers to an operation of applying a reduction voltage or current to the working electrode to selectively electrodeposit a compound thin film on the working electrode along a shape of the electrode at which the specific pattern is patterned.

Further, before the operation S200 of configuring the electrodeposition circuit, the method 1 of manufacturing a compound thin film may further include the electrode substrate forming operation S100 of forming an electrode substrate at which a specific pattern is patterned to provide a position on which the thin film will be formed.

Referring to FIGS. 2 and 3 illustrating a detailed process of the electrode substrate forming operation S100, as shown in FIG. 2, the operation S100 of forming an electrode substrate may include an operation S110 of forming the electrode on the predetermined substrate, an operation S120 of forming the specific pattern using photolithography forming a photoresist on the electrode, an operation S130 of forming a passivation film or a recombination preventing film in a predetermined region on the electrode, and an operation S140 of removing the photoresist formed on the electrode.

Further, as shown in FIG. 3, the operation S100 of forming an electrode substrate may include the operation S110 of forming the electrode on the predetermined substrate, an operation S121 of forming the specific pattern on the electrode using a laser, and the operation S130 of forming the passivation film or the recombination preventing film in the predetermined region on the electrode.

That is, when the specific pattern is patterned on the electrode in the operation S100 of forming an electrode substrate, photolithography or a laser processing may be used according to various embodiments, but the present invention is not limited thereto.

Further, the predetermined substrate described herein may be formed of a soda-lime glass, and the electrode at which the specific pattern is patterned may be used as a back contact of a solar cell and may be formed of molybdenum (Mo), and the specific pattern may be a pattern in the form of one or more circular or polygonal hollow holes, but the present invention is not limited thereto. Thus, materials of the substrate and the electrode may be selected from any material capable of forming the substrate and the electrode, and the patterned pattern may be modified in any form.

Further, the electrolytic solution described herein may have a predetermined pH by dissolving one or more among potassium chloride (KCl), sulfamic acid ($HSO_3NH_2$), potassium hydrogenphthalate (($KOOC)C_6H_4COOH$), selenium dioxide ($SeO_2$), copper chloride dehydrate, and indium chloride in distilled water. The electrochemical cell described herein may further include a counter electrode formed of platinum, and a reference electrode formed of silver or silver chloride in addition to the working electrode.

Furthermore, the predetermined region of the electrode, at which the specific pattern is patterned, in the operation S100 of forming an electrode substrate may be a lateral surface of the electrode at which the specific pattern is patterned or may be a cut surface generated as the specific pattern is patterned on the electrode.

In the operation S130 of forming the passivation film or the recombination preventing film in the predetermined region on the electrode shown in FIGS. 2 and 3, the passivation film may be formed of one or more materials selected from among an oxide, a nitride, and a sulfide which are made of nickel, tungsten, molybdenum, copper, titanium, zinc, tin, iron, chrome, silicon, magnesium, or an alloy thereof, and any material may be used as long as it has high light transmittance to prevent occurrence of light transmittance loss of a solar cell due to application of the passivation film while preventing a shunt loss and a recombination loss caused by exposure of the lateral surface or the cut surface of the patterned electrode.

Further, the operation S130 of forming the passivation film or the recombination preventing film in the predetermined region on the electrode may be an operation of forming a passivation film or a recombination preventing film in a predetermined region on the electrode using one coating method of vacuum deposition, such as sputtering, thermal evaporation, e-beam evaporation, and atomic layer deposition, and non-vacuum coating, such as spin coating, doctor blading, spraying, electro-spraying, and electrodeposition.

Referring back to FIG. 1, the method 1 of manufacturing a compound thin film may further include an operation S400 of performing heat treatment after the operation S300 of forming the compound thin film. In the operation S400 of performing heat treatment, the thin film formed according to the operation S300 of forming the compound thin film may be heat-treated under a selenium (Se) or sulfur (S) containing gas atmosphere, but heat treatment is not necessarily performed under a Se or S containing gas atmosphere and may be performed under various gases atmosphere, and a heat treatment temperature and a heat treatment time may be variously set.

Referring to FIG. 4 which is a schematic diagram illustrating a portion of processes in the method 1 of manufacturing a compound thin film described above with reference to FIGS. 1 to 3, a reference numeral 401 may correspond to the predetermined substrate described with reference to FIGS. 1 to 3, a reference numeral 402 may correspond to the electrode described with reference to FIGS. 1 to 3, a reference numeral 403 may be the photoresist described with reference to FIGS. 1 to 3, a reference numeral 404 may be the passivation film or the recombination preventing film described with reference to FIGS. 1 to 3, and a reference numeral 405 may be the thin film described with reference to FIGS. 1 to 3.

A reference numeral 410 schematically illustrates the operation S110 which is an operation of forming the electrode 402 on the predetermined substrate 401, and a reference numeral 420 schematically illustrates an operation of forming the photoresist 403 (or a photoresist layer) having a specific pattern on the electrode 402 and may correspond to the operation S120.

A reference numeral 430 illustrates an operation of forming the passivation film 404 (or a passivation layer) on the photoresist 403 and may corresponds to the operation S130, and a reference numeral 440 illustrates an operation of removing the photoresist 403 and may corresponds to the operation S140.

A reference numeral 450 schematically illustrates an operation of forming the thin film 405 after the operation S300 or the operation S400. The thin film 405 may serve as a light absorption layer, and a solar cell formed to include the thin film 405 may have light transmittance by virtue of some hollow holes.

Figure 5:
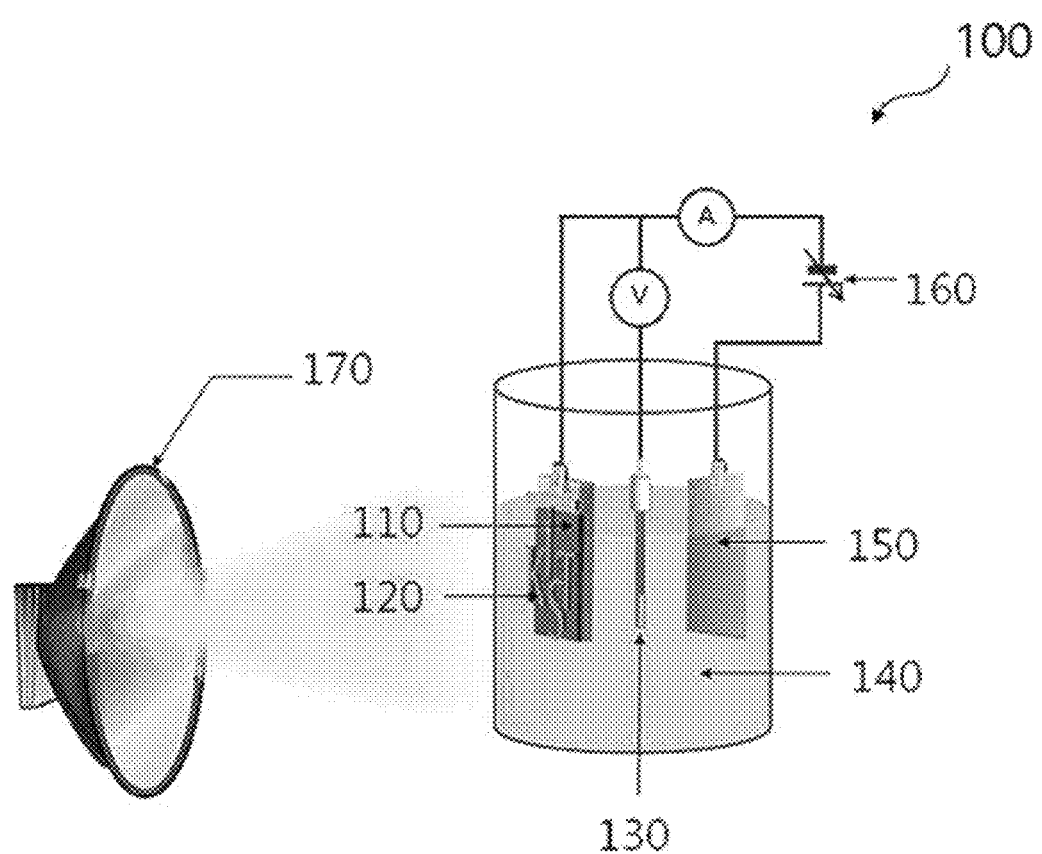
FIG. 5 is a schematic diagram illustrating a configuration of an electrodeposition circuit using an electrochemical cell for manufacturing a compound thin film according to one embodiment of the present invention.

FIG. 5 is a schematic diagram illustrating a configuration of the electrodeposition circuit 100 using an electrochemical cell for performing the operation S200 of configuring the electrodeposition circuit and the operation S300 of forming the compound thin film in the method 1 for manufacturing a compound thin film.

The electrodeposition circuit 100 using the electrochemical cell may be configured such that an electrolytic solution 140 fills in an electrolytic bath and a substrate, a working electrode 110, a counter electrode 150, and a reference electrode 130 are provided. In addition to the above-mentioned, the electrodeposition circuit 100 may further separately include a light source 170 for providing light.

The electrolytic solution 140 may include a precursor of elements constituting a CIS-based compound, a solvent, and additives such as other counter ion sources and complexing agents. For example, the precursor may be a metal, such as Cu, In, Ga, Zn, Sn, Ag, or Al, or a chloride, a sulphate, a nitrate, an acetate, or a hydroxide of an alloy of two or more among Cu, In, Ga, Zn, Sn, Ag, and Al, and the precursor may be a non-metal precursor such as $SeO_2$, selenious acid ($H_2SeO_3$), or selenium chloride ($SeCl_4$). In other embodiments, a material or a compound may be used as the precursor as long as it is capable of forming a CIS-based thin film by being electrodeposited through electrodeposition without limitation.

Further, when precursors of Cu, In, and Se are used as the precursor, an atomic ratio of Cu, In, and Se contained in the electrolytic solution 140 including such precursors is 0.8 to 1.2:1 to 5:1.8 to 2.2. For example, the above-described atomic ratio may be 1:4:2. When a precursor composition is formed to satisfy such an atomic ratio, it is possible to manufacture a compound thin film having more excellent light absorption efficiency and excellent flatness and density.

Further, in the operation S200 of configuring the electrodeposition circuit, an electrolytic solution is produced by mixing the above-described precursor with an appropriate solvent. At this point, a solvent may be used without limitation as long as it is capable of dissolving the above-described precursor and having conductivity suitable for performing electrodeposition. For example, the solvent used to produce the electrolytic solution in the operation S200 of configuring the electrodeposition circuit may be water, alcohol or a mixture of water and alcohol.

Further, a pH of the electrolytic solution produced by mixing the precursor and the solvent in the operation S200 of configuring the electrodeposition circuit may be maintained in the range of 1.5 to 3. This is because, when the pH of the electrolytic solution 140 is less than 1.5 or more than 3, it is difficult to produce a uniform thin film, and a problem of precipitation of a plate phase such as CuSe may occur. However, the present invention is not necessarily limited to such a pH value.

In addition to the precursor and the solvent, the electrolytic solution 140 may further include a supporting electrolyte and a complexing agent as additives. The supporting electrolyte is to increase electrical conductivity of the electrolytic solution 140. For example, the supporting electrolyte may be formed of a material such as KCl or lithium chloride (LiCl).

Further, the complexing agent is a substance for controlling mobility of specific ions in the electrolytic solution 140. For example, the complexing agent may be made of a mixture of two or more selected from the group consisting of triethanolamine ($N(CH_2CH_3)_3$), citric acid ($C_6H_8O_7$), tartaric acid ($C_4H_6O_6$), $NH_2SO_3H$, sodium citrate ($Na_3C_6H_5O_7$), potassium hydrogenphthalate ($C_8H_5KO_4$), and potassium thiocyanate (KSCN), but the present invention is not limited thereto.

The electrolytic bath may facilitate transmittance of light using a transparent material such as quartz, glass, or the like. Further, the substrate is a target to which a CIS-based compound serving as a light absorption layer is electrodeposited and may be a substrate containing molybdenum. Generally, a substrate containing molybdenum has excellent electrical conductivity, is relatively inexpensive, has a thermal expansion coefficient similar to that of a CIS-based compound serving as a light absorption layer, and is excellent in ohmic contact.

Meanwhile, a metal substrate may be used as the substrate. When the metal substrate is used, molybdenum may not be included, and in this case, a material of the substrate is not specifically limited.

Each of the counter electrode 150 and the reference electrode 130 may be configured with an electrode made of a material which is commonly used in electrodeposition. The counter electrode 150 and the reference electrode 130 may be variously configured without particular limitation on a size and a shape. For example, a platinum (Pt) electrode may be used as the counter electrode 150 and a molybdenum substrate may be used as a substrate to which a CIS-based compound is electrodeposited. When the Pt electrode is used as the counter electrode 150, a configuration of the electrodeposition circuit 100 has "(−) Mo|CIS [405]|electrolyte|Pt (+)."

In the electrodeposition circuit 100 while a compound thin film is grown through electrodeposition, i) a flow of electrons or holes in the Mo substrate and the compound thin film (CIS), ii) a reduction reaction of cations occurring at a CIS/electrolyte interface, iii) diffusion of ions in the electrolyte, and iv) an oxidation reaction of anions occurring in the counter electrode (Pt) sequentially occur to form a single closed circuit. In this case, a thickness t of the compound thin film formed through electrodeposition is proportional to an amount of charges flowing to the electrodeposition circuit 100 as in the following Equation 1.

$$t = \frac{\int I \cdot dt_{ED}}{nF} \cdot \frac{M}{A\rho},$$ [Equation 1]

In Equation 1, I denotes a current flowing to the electrodeposition circuit 100, $t_{ED}$ denotes a time taken for electrodeposition, n denotes the sum of the number of charges of ions constituting a compound (n=13 in CIS), F denotes a Faraday constant, M denotes a molecular weight of the compound, A denotes an area of a thin film, and p denotes a density of the thin film.

A current flowing under a given voltage is proportional to reaction rates of i) to iv), and when one of the reaction rates is relatively slower than the remaining reaction rates, an overall reaction rate is determined by the slowest reaction rate. Thus, in various embodiments of the present invention, light is irradiated and used as a catalyst in overall reactions including i) to iv), and the irradiated light promotes the slowest reaction rate among i) to iv) such that an effect of promoting the overall reaction rate can be achieved.

The method 1 for manufacturing a compound thin film manufactures a compound thin film through photoelectrochemical deposition (light electrodeposition) using the light source 170 in a state in which a light blocking part 120 having a pattern, which will be implemented, on a surface of a thin film is positioned on the working electrode 110 such that the compound thin film having a surface on which a desired pattern is implemented may be provided by a difference in thickness between a region receiving light and a region not receiving the light of the compound thin film.

In this case, the light source 170 should be able to irradiate the light to an entire area of the substrate. When the irradiated light has a wavelength that is shorter than a wavelength corresponding to a bandgap of the compound thin film manufactured by electrodeposition, various lighting lamps may be used without limitation on a size, a shape, and a type.

Owing to a difference in thickness between the region receiving the light (a region in which the light reaches) and the light blocking part 120, e.g., a region in which the light is blocked by a photomask (a region in which the light does not reach) while the compound thin film is grown through light electrodeposition, the compound thin film manufactured according to the method 1 of manufacturing a compound thin film may have light transmittance by which a specific pattern in the form of a hollow hole is patterned as well as have a surface pattern corresponding to a shape of the light blocking part 120 (a thickness difference induction phenomenon), thereby having excellent aesthetic impression.

When the light blocking part 120 is the photomask, the photomask may be used without limitation as long as it is chemically stable in the electrolytic solution 140. Further, as described above, in order to definitely induce a thickness difference of the compound thin film due to blocking of the light, an antireflection film may be provided on a rear surface of the photomask. According to light electrodeposition performed in another embodiment, a thicker compound thin film in comparison to conventional electrodeposition may be manufactured under conditions of the same electric field strength and the same time.

For example, the operation S300 of forming the compound thin film through application of a current or a voltage may be performed under the condition of a room temperature and an atmospheric pressure, i.e., a temperature in the range of 0 to 80° C. and a pressure in the range of 0.9 to 1.1 atm., and a voltage for applying a current (application of a current by a direct current (DC) voltage) may be in the range of −0.4 to −0.6 V (e.g., −0.5 V), but the present invention is not limited thereto. Further, a voltage application time may be 1 to 130 minutes. Furthermore, an operation of applying a reduction voltage or current to the working electrode 110 using a current or voltage supply device 160 and an operation of irradiating the light toward a light blocking part 120 using the light source 170 may be simultaneously performed.

Moreover, unlike the above-mentioned, the operation S300 of forming the compound thin film may be an operation of massively stacking elements of Cu, In, Ga, and Se, an alloy of two or more kinds of the elements (e.g., Cu—In and Cu—Ga), or a compound of two or more kinds of the elements (e.g., Cu—Se, In—Se, and Ga—Se) and then forming a CIGS thin film (a single CIGS layer) through heat treatment.

Such an operation of forming the thin film may secure a relatively fast process speed than the above-described operation of forming the compound thin film through the electrodeposition circuit 100 and may be applied to an inline process.

Alternatively, when the compound thin film is formed through the electrodeposition circuit 100, the operation S300 of forming the compound thin film and the operation S400 of performing heat treatment may be implemented by allowing Se or S existing in the atmospheric gas to react the metal precursor film during heat treatment to synthesize a CIGS thin film without including Se or S in the compound thin film.

The method 1 of manufacturing a compound thin film may further an operation (not shown) of forming a color layer on the compound thin film through light electrodeposition using the compound thin film formed according to the operation S300 of forming the compound thin film as the working electrode 110. The color layer formed through the operation of forming the color layer may be a layer formed of CuSe.

In addition to the operation of forming the color layer, as described above, the method 1 of manufacturing a compound thin film may further include the operation S400 of performing heat treatment. The operation S400 of performing heat treatment is an operation for densification of a fine structure through a shape formation or a grain growth of the electrodeposited compound thin film, and at this point, a heat treatment temperature may be in the range of 200° C. to 700° C.

Through such heat treatment, Se or S which is in a gaseous phase may react with Mo to form molybdenum selenide ($MoSe_2$) or molybdenum sulfide ($MoS_2$). $MoSe_2$ or $MoS_2$ having an appropriate thickness may increase adhesion and improve an ohmic contact. For example, the appropriate thickness may be set in the range of 50 to 150 nm, but the present invention is not necessarily limited thereto.

In various embodiments, the compound thin film finally manufactured according to the method 1 of manufacturing a compound thin film may be a CIS-based compound thin film and may have the following composition.

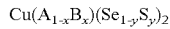

$Cu(A_{1-x}B_x)(Se_{1-y}S_y)_2$

Each of A and B is independently one element selected from the group consisting of In, Ga, Zn, Sn, and Al, and $0 \leq x$, $y \leq 1$.

Accordingly, examples of the CIS-based thin film may include a CIS thin film, a CIGS thin film, and a CZTS thin film. As described above, the compound thin film manufactured according to the method 1 of manufacturing a compound thin film may be such a CIS-based thin film.

Various embodiments may provide a CIS-based thin film or a compound thin film manufactured through electrochemical deposition, selective electrodeposition, and self-accelerated photoelectrochemical deposition as described above. Since a fine structure of the CIS-based thin film or the compound thin film is dense and a surface thereof is flat and uniform, the CIS-based thin film or the compound thin film may be used as a light absorption thin film of high efficiency and high quality, and specifically, the CIS-based thin film or the compound thin film may be a thin film having a copper-deficient composition essential for a high efficiency CIS solar cell. Further, various embodiments of the present invention may provide a thin film solar cell using such a high-quality thin film as a light absorption layer.

According to various embodiments of the present invention, a high added value solar cell having both light transmittance and aesthetic impression may be implemented.

A desired pattern may be formed at the solar cell according to the present embodiment by forming a difference in light transmittance. The desired pattern may be formed on the solar cell by forming the compound thin film after forming the electrode substrate, at which the desired pattern is patterned, in the operation S100 of forming the electrode substrate (see FIG. 1).

As shown in FIG. 2, a process of forming the electrode substrate, at which the desired pattern is patterned, may be performed in the operation S100 of forming the electrode substrate by including an operation of patterning the photoresist on the electrode substrate with the desired pattern. The electrode substrate having the electrode patterned with the desired pattern may be formed by etching the patterned photoresist using an etch mask. Alternatively, a substrate on which an electrode layer is formed may be patterned with a laser to form an electrode substrate on which an electrode having a desired pattern is formed.

Figure 15A:
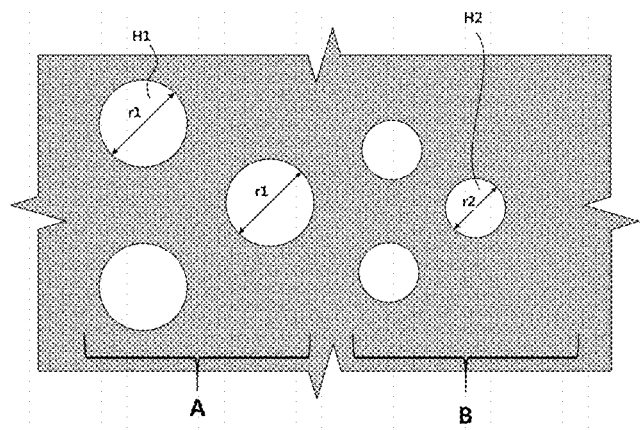
FIGS. 15A to 15C are diagrams illustrating an embodiment of a solar cell according to the present invention.
Figure 15B:
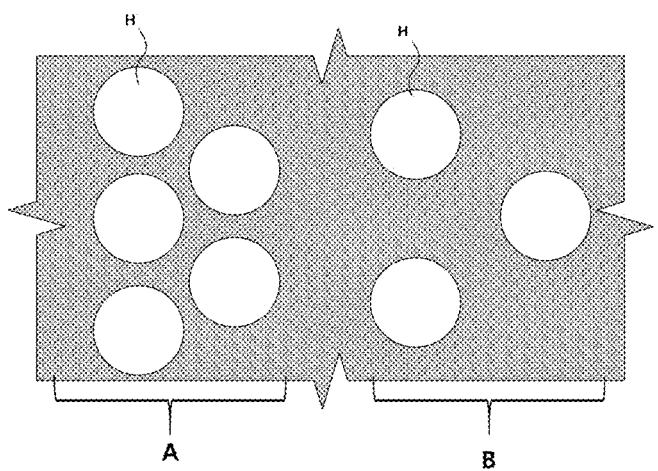
Figure 15C:
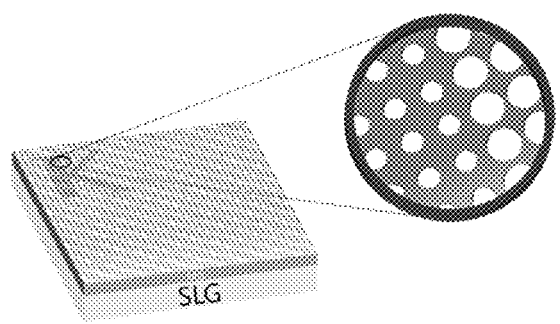

FIGS. 15A to 15C are diagrams illustrating an embodiment of a solar cell according to the present invention. The desired pattern may be formed by adjusting a diameter of a hollow or a distance between hollows to control light transmittance. As in an example shown in FIG. 15A, a diameter r2 of a hollow H2 is smaller than a diameter r1 of a hollow H1, and Region B in which the hollow H2 having a smaller diameter is formed has light transmittance lower than that of Region A in which the hollow H1 having a larger diameter is formed. Accordingly, a plurality of hollows having different diameters may be disposed to form a desired pattern.

Referring to an example shown in FIG. 15 B, light transmittance may be controlled by adjusting an interval between hollows H. For example, hollows disposed in Region A are positioned closer to each other than hollows disposed in Region B such that Region A has higher light transmittance. Therefore, it is possible to form a desired pattern by adjusting intervals between the hollows H.

FIG. 15C is a schematic diagram illustrating an electrode at which a pattern corresponding to an alphabetical character "K" is formed according to the above-described examples. Referring to FIG. 15C, as in the above-described examples, light transmission may be controlled by adjusting the intervals between the hollows and the diameters of the hollows. The desired pattern may be formed by controlling the light transmittance.

Figure 16:
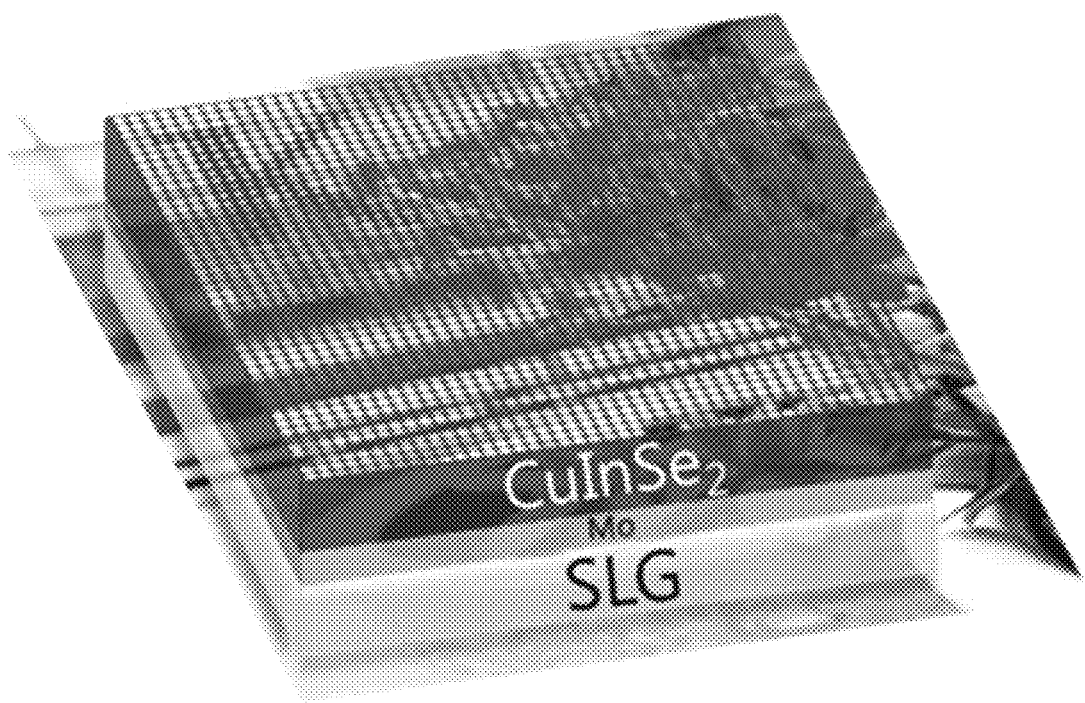
FIG. 16 is an overview diagram of a solar cell having a pattern formed thereon.

FIG. 16 is an overview diagram of a solar cell having a pattern formed thereon. Referring to FIG. 16, since the solar cell according to the present invention has light transmittance, there is an advantage in that a field of view with respect to a rear surface may not be blocked and an aesthetic design element may be added due to a pattern. The pattern may be applied to implement a product logo on the exterior of building, a glass and a sunroof of a vehicle, a portable electronic device, and the like.

According to the present invention, no loss of a precursor material of the solar cell occurs during manufacturing of a compound thin film solar cell in which light transmittance and a pattern are implemented by adjusting sizes of hollow holes or intervals between the hollow holes of the patterned electrode. Consequently, there is an effect of reducing a manufacturing production cost of a compound thin film solar cell including the compound thin film manufactured according to the present invention.

According to the present invention, an additional manufacturing process is not required in order to impart light transmittance and, simultaneously, form a specific pattern such that there are advantages in that productivity can be improved during manufacturing and multi-stage strict process control is not required.

Hereinafter, the present invention will be described in more detail by comparing an experimental example with comparative examples, and the following experimental example is intended to help understand of the present invention and is not intended to limit the scope of the present invention.

Experimental Example

In order to implement the method 1 of manufacturing a compound thin film, an electrode (back contact) configured by depositing molybdenum on a soda-lime glass with a thickness of 1 μm using DC sputtering was used.

A process of patterning the back contact is as follows.

First, a photoresist (photosensitive agent) is laminated on the back contact. In order to enhance adhesive strength between a substrate and the photoresist, hexamethyldisilazane (HMDS) is applied and then the photoresist is applied. HMDS was spin-coated at 3000 rpm for 30 seconds, and the photoresist was spin-coated at 1000 rpm for 10 seconds using AZ 5214E material of Merck & Co., Inc. and then was spin-coated at 5000 rpm for 40 seconds.

After the photoresist spin-coating, a back contact substrate undergone a soft-bake treatment for 120 seconds on a hot-plate at 120° C., and then a Cr photomask having a predetermined pattern was aligned on the back contact on which the photoresist was applied to perform exposing. The pattern of the Cr mask is a pattern in which circular Cr having a diameter of 90 μm is vertically and horizontally disposed at an interval of 146 μm. As a result, a light absorption layer was designed to have an aperture ratio of about 30% and light transmittance.

After exposing, the back contact substrate was developed for 45 seconds using an aqueous solution containing a main raw material of tetramethylammonium hydroxide (TMAH) as a developer. Then, the developer and the remaining photosensitive agent were removed with distilled water and sufficiently dried.

After developing, the back contact substrate was immersed in an etching solution capable of removing Mo, and a portion not covered with the photoresist was etched and removed, thereby forming a pattern on the back contact. The used etching solution was TWME-600 (Poongwon Co., Ltd.) having a main raw material of nitric acid.

In order to form a passivation film for preventing a shunt loss and a recombination loss of the solar cell on a lateral surface or a cut surface of the patterned back contact, 0.7 M nickel acetate dihydrate and 0.7 M ethanolamine were dissolved in anhydrous isopropyl alcohol of 2 ml to react on a hot plate of 70° C. at 300 rpm for 12 hours to produce a precursor solution, and then the passivation film precursor solution was spin-coated on the patterned back contact substrate at 3000 rpm for 30 seconds.

The photoresist on top of the patterned back contact was removed using acetone solution, and heat treatment was performed on a hot plate of 275° C. for 1 hour to oxidize the passivation precursor film applied on the lateral surface or the cut surface of the patterned back contact.

An electrolytic solution for electrodeposition was produced by dissolving 240 mM KCL, 12 mM sulfamic acid, 12 mM potassium hydrogenphthalate, 5.2 mM selenium dioxide, 2.4 mM copper chloride dehydrate, and 9.6 mM indium chloride in distilled water of 120 ml to maintain a pH of 2.2.

In order to form a light absorption thin film having designed light transmittance, the back contact substrate of which the lateral surface or the cut surface is passivated was used as a working electrode, a Pt electrode was used as a counter electrode, and a Ag/AgCl electrode was used as a reference electrode in the produced electrolytic solution, and a CIS-based thin film was manufactured by applying a constant voltage of −0.56 V with respect to the reference electrode for 5400 seconds using a PARSTS MC potentiostat of AMETEK, Inc. Through the above-described process, the CIS-based light absorption thin film may be formed only on the remaining region except for a region in which the Mo back contact is etched and removed.

The manufactured CIS thin film was inserted into a quartz tube and was heat-treated at a temperature of 580° C. for 30 minutes. In order to control a Se atmosphere in a reactor, Se was input to an alumina crucible in the quartz tube and was evaporated at a temperature of 300° C., and argon (Ar) gas constantly flowed at a rate of 100 sccm.

Figure 6:
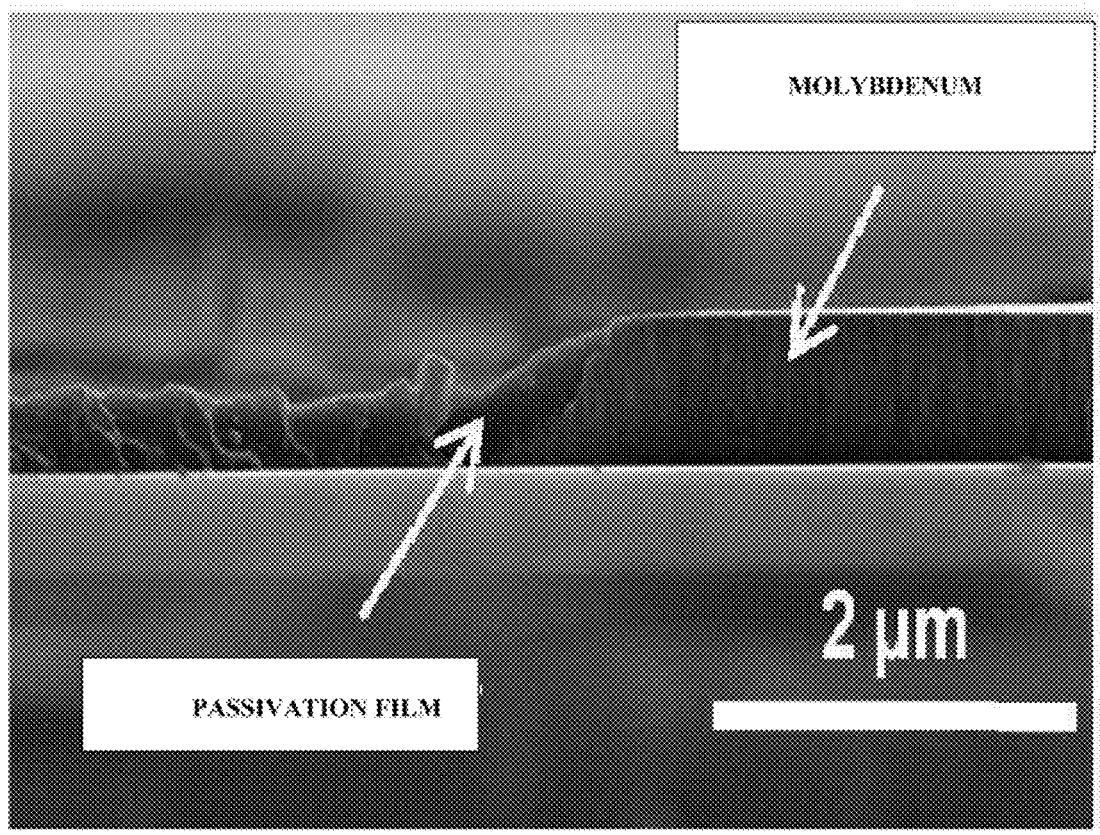
FIG. 6 is a cross-sectional scanning electron microscope (SEM) photograph of an electrode which undergoes patterning and passivation according to an experimental example.
Figure 7:
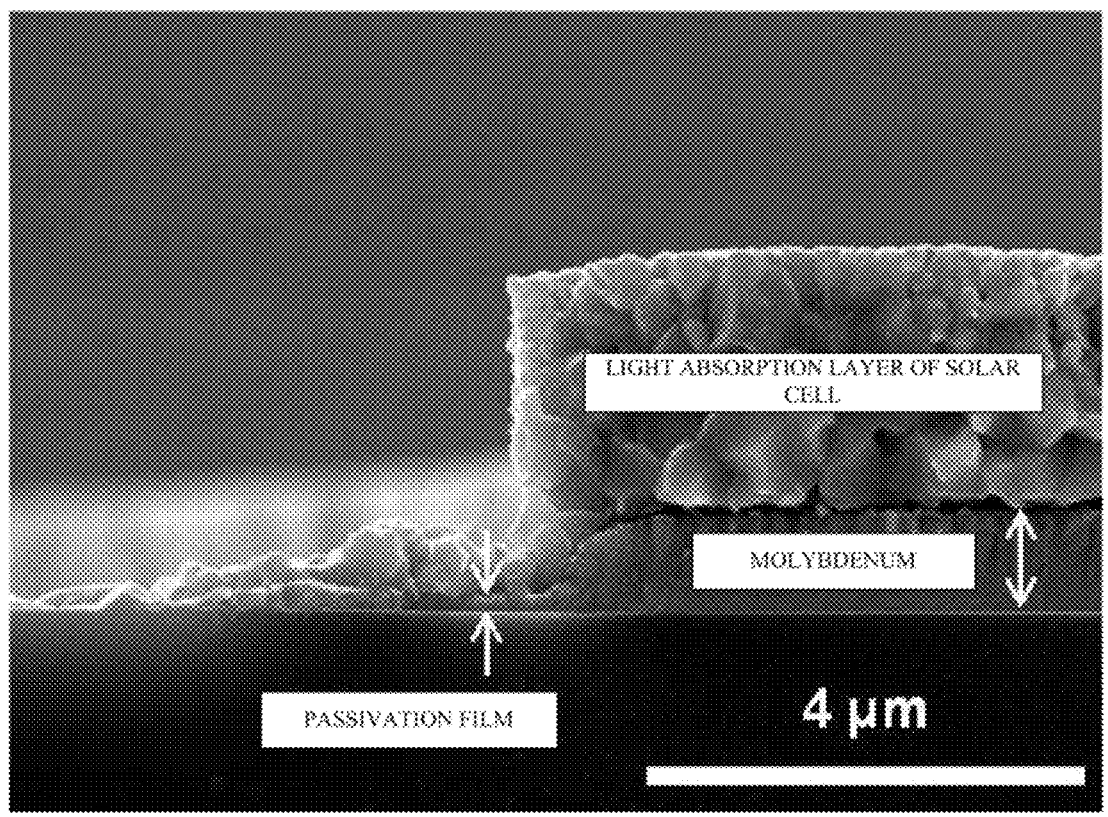
FIG. 7 is a cross-sectional SEM photograph of a thin film which is selectively formed on the electrode which undergoes patterning and passivation according to the experimental example.

A field emission scanning (FE-SEM) (Inspect F50) was used to observe a cross-sectional morphology of the patterned and passivated back contact and the CIS-based light absorption thin film which was selectively formed on the patterned and passivated back contact, and the observation results were shown in FIGS. 6 and 7.

Referring to FIG. 6, in comparison to a comparative example (FIG. 10) which will be described below, it can be seen that the Mo back contact was etched and the passivation film covering the patterned Mo back contact was formed at the lateral surface or the cut surface with a thickness of about 150 nm according to the experimental example.

Further, referring to FIG. 7, it can be confirmed that the CIS-based thin film is selectively formed according to a shape of the patterned back contact substrate of which the lateral surface or the cut surface is passivated according to the experimental example.

Figure 8:
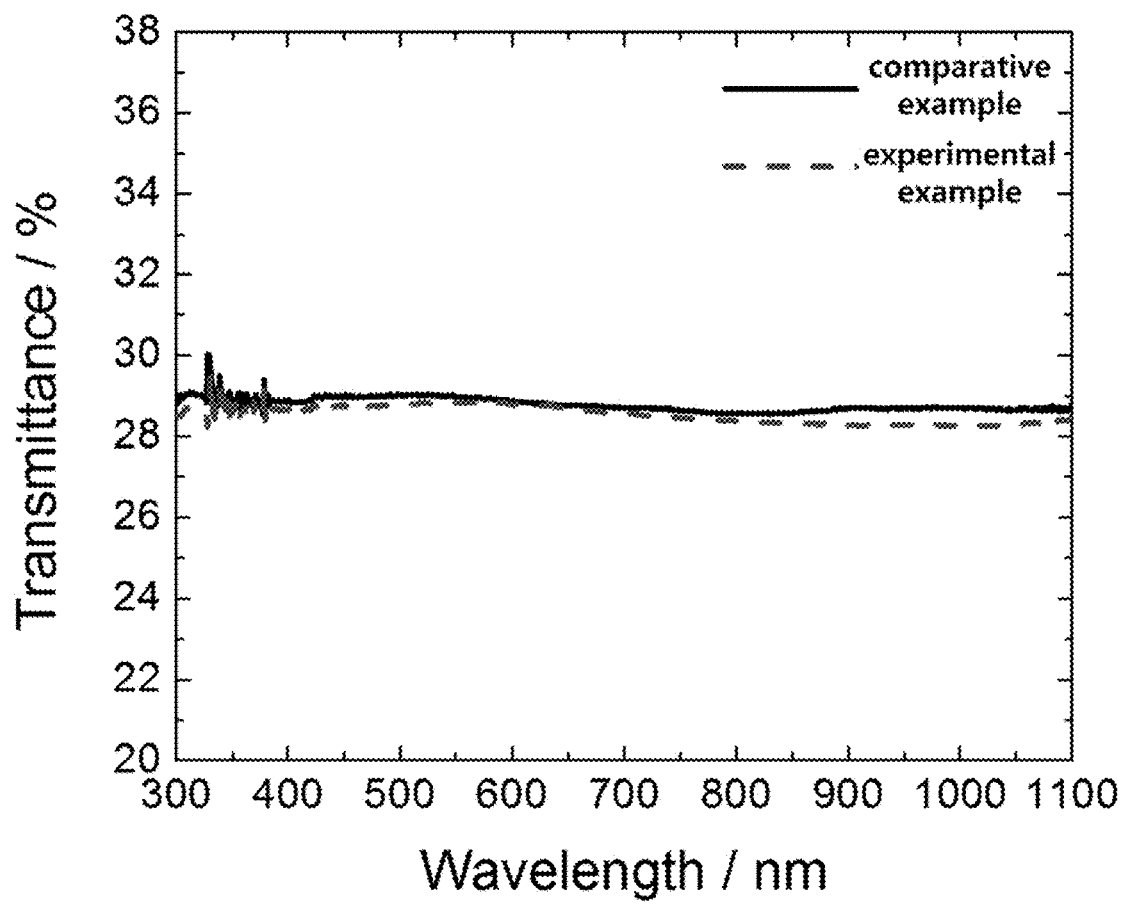
FIG. 8 is a graph for comparing light transmittance characteristics of a thin film manufactured in the form in which a passivation film is formed according to the experimental example and a thin film manufactured without a passivation film according to a comparative example 2.

FIG. 8 is a graph showing a measurement result of light transmittance characteristics of the CIS-based light absorption thin film manufactured by the above-described experimental example and a CIS-based light absorption thin film manufactured without a passivation film by a comparative example, which will be described below, using a ultraviolet to visible light spectrometer (Lamda 35 by PerkinElmer Co., Ltd.) so as to confirm whether light transmittance of the solar cell is degraded by forming the passivation film.

According to FIG. 8, it can be seen that a loss of the light transmittance of the solar cell manufactured according to the experimental example is less than 1% in comparison to the comparative example which will be described below. That is, it can be seen that the solar cell having high light transmittance as designed by the photomask can be manufactured with almost no loss of the light transmittance in comparison to the comparative example, which will be described below, even though the passivation film is formed at the lateral surface or the cut surface of the patterned back contact according to the experimental example.

Comparative Example 1

A CIS-based thin film was formed by the same electrodeposition using the same electrolytic solution produced in the above-described experimental example, and a back contact substrate which is not patterned was prepared to form a CIS-based light absorption thin film on the back contact substrate.

Figure 9A:
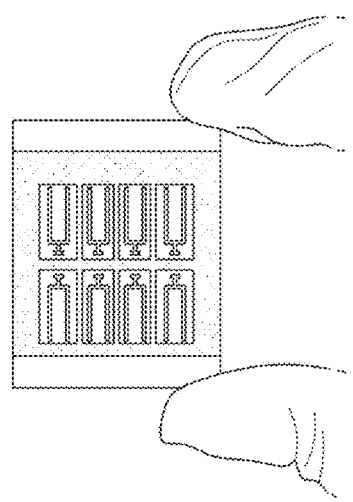
FIGS. 9A to 9C are diagrams illustrating an example of a solar cell manufactured according to the experimental example and an example of a conventional solar cell manufactured by a conventional technique.
Figure 9B:
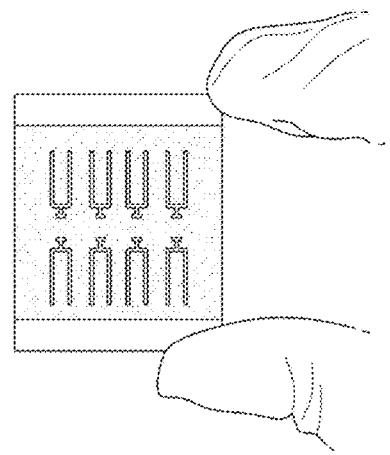
Figure 9C:
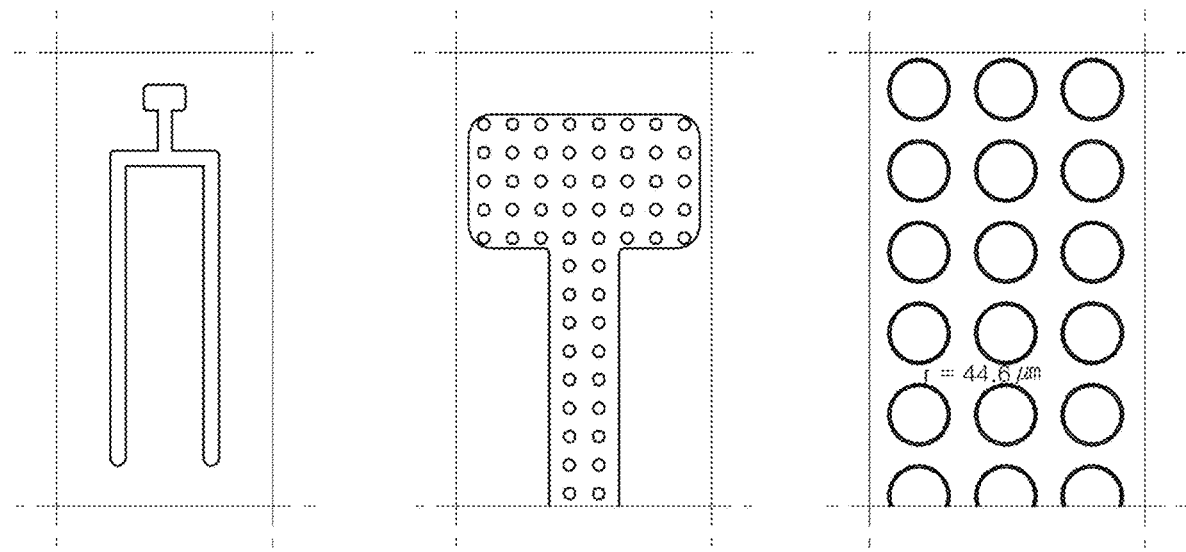

FIGS. 9A and 9B are photographs illustrating a light transmission type CIS-based solar cell manufactured according to the above-described experimental example and a conventional CIS-based solar cell manufactured according to the comparative example 1, and FIG. 9C is a photograph enlarging FIG. 9A.

Referring to FIGS. 9A to 9C, it can be seen that the CIS-based thin film manufactured by the comparative example 1 is opaque, while the CIS-based thin film formed on the back contact which was patterned and of which the lateral surface or the cut surface was passivated has a translucent characteristic.

Comparative Example 2

A CIS-based thin film was formed by the same electrodeposition using the same electrolytic solution produced in the above-described experimental example, and a back contact substrate was prepared in a condition in which a passivation film was not formed on a lateral surface or a cut surface of a patterned back contact during formation of the patterned back contact to form a CIS-based light absorption thin film on the back contact substrate.

Figure 10:
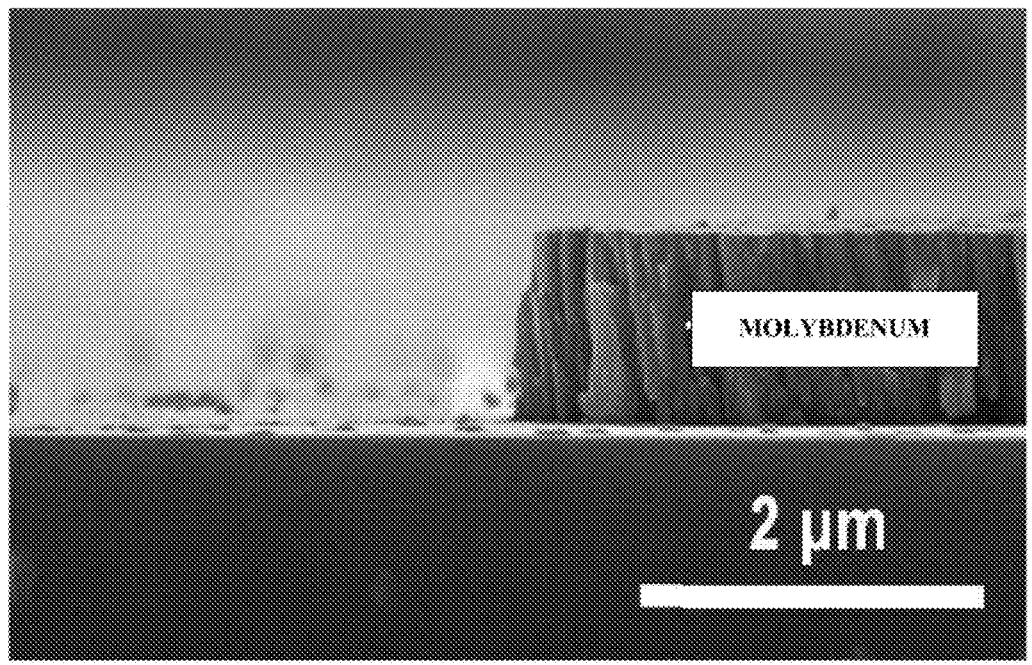
FIG. 10 is a cross-sectional SEM photograph of an electrode which undergoes patterning and does not include a passivation film according to the comparative example 2.
Figure 11:
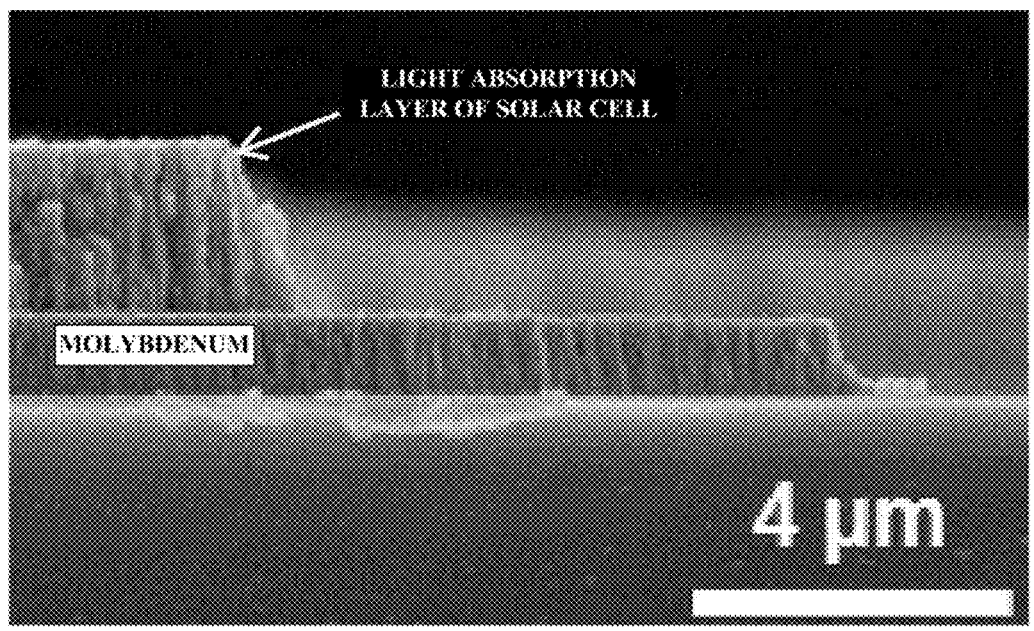
FIG. 11 is a cross-sectional SEM photograph of a thin film which is selectively formed on the electrode which undergoes patterning and does not include a passivation film according to the comparative example 2.

Cross-sectional morphologies of the back contact substrate which was patterned but not including the passivation film and the CIS-based light absorption thin film formed on the back contact substrate were observed as in the above-described experimental example, and the observation results were shown in FIGS. 10 and 11.

Referring to FIG. 10, it can be seen that there is no passivation film at the lateral surface of the Mo back contact manufactured according to the comparative example 2, as compared with the cross-sectional photograph (FIG. 6) of the patterned and passivated back contact manufactured according to the experimental example.

Further, referring to FIG. 11, it can be confirmed that, when the light absorption thin film is deposited by electroless plating in a region in which the back contact is etched and removed, a portion of an upper surface of the back contact is exposed as well as the lateral surface or the cut surface of the back contact is exposed during a process of removing the light absorption thin film. This may cause formation of a shunt path while a window layer is in contact with a region in which the back contact is exposed when the window layer is deposited during a subsequent manufacturing process of the solar cell, thereby acting a factor of degrading photoelectric conversion efficiency of the solar cell.

The CIS-based light absorption thin films manufactured in the above-described experimental example and comparative example 2 were immersed in an aqueous solution, in which cadmium sulfate, thiourea, ammonia water, and distilled water are mixed, at a temperature of 60° C. for 15 minutes to coat a CdS thin film serving as a buffer layer, and a zinc oxide (ZnO) layer and an Al-doped ZnO layer were deposited on the CdS thin film by alternating current (AC) radio frequency (RF) sputtering, thereby forming the window layer. A nickel layer and an Al layer, which are used as a collector electrode, are respectively deposited on the window layer with thicknesses of 50 nm and 400 nm by a vacuum evaporator, thereby completing a solar cell device.

Figure 12:
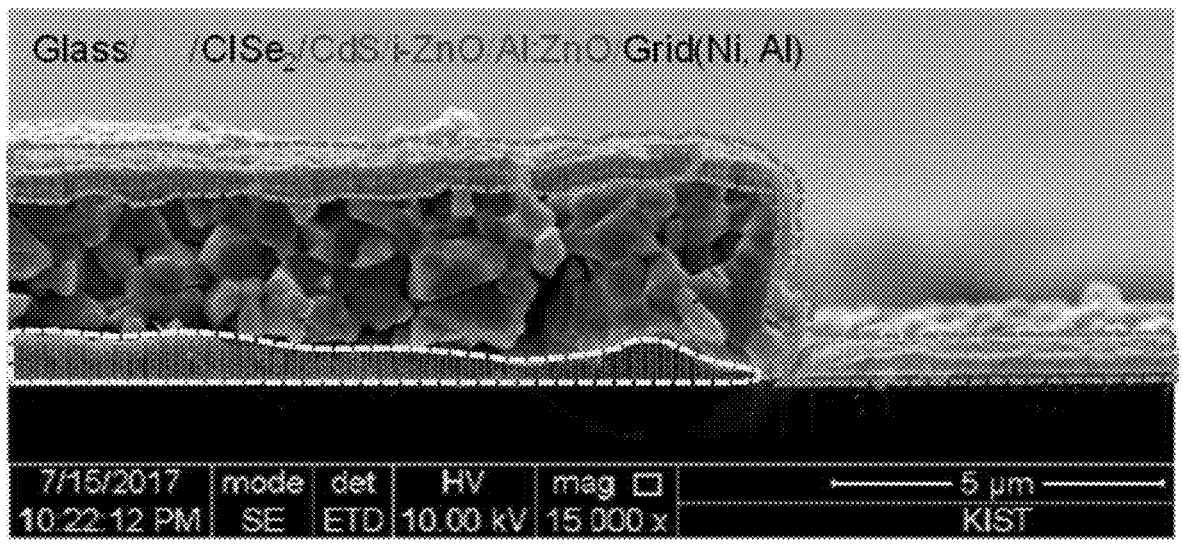
FIG. 12 is an SEM photograph showing a cross section of a solar cell which is manufactured according to the experimental example.

FIG. 12 is an SEM photograph showing a cross section of a CIS solar cell which is manufactured according to the experimental example of the present invention. A current-voltage characteristic of each of the solar cell devices was measured using a solar simulator (YSS-50S by Yamashita Denso Corporation).

Figure 13A:
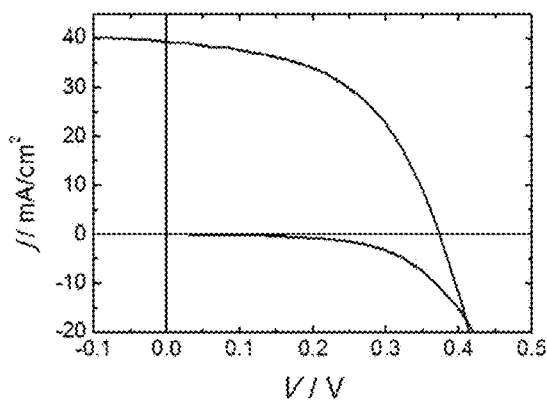
FIGS. 13A and 13B are graphs showing current-voltage characteristics of solar cell devices including the thin films manufactured by the comparative example 2 and the experimental example, respectively.
Figure 13B:
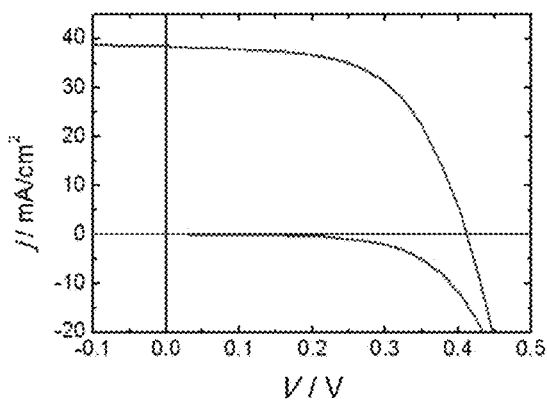

FIGS. 13A and 13B are graphs showing current-voltage characteristics of the solar cell devices using the CIS-based light absorption thin film manufactured according to the experimental example and the comparative example 2.

In the solar cell manufactured according to the comparative example 2, as illustrated by FIG. 13A, an open circuit voltage VOC was measured as 0.374 V, a short circuit current density JSC was measured as 39.4 mA/cm$^2$, a filling rate was measured as 0.506, and photoelectric efficiency was measured as 7.46%, whereas in the solar cell manufactured according to the experimental example, as illustrated by FIG. 13B, an open circuit voltage VOC was measured as 0.411 V, a short circuit current density JSC was measured as 38.4 mA/cm$^2$, a filling rate was measured as 0.590, and photoelectric efficiency was measured as 9.31%. Therefore, it can be seen from FIGS. 13A and 13B that the open circuit voltage, the filling rate, and the photoelectric efficiency are significantly increased in the solar cell manufactured according to the experimental example, as compared with the solar cell manufactured according to the comparative example 2.

Figure 14:
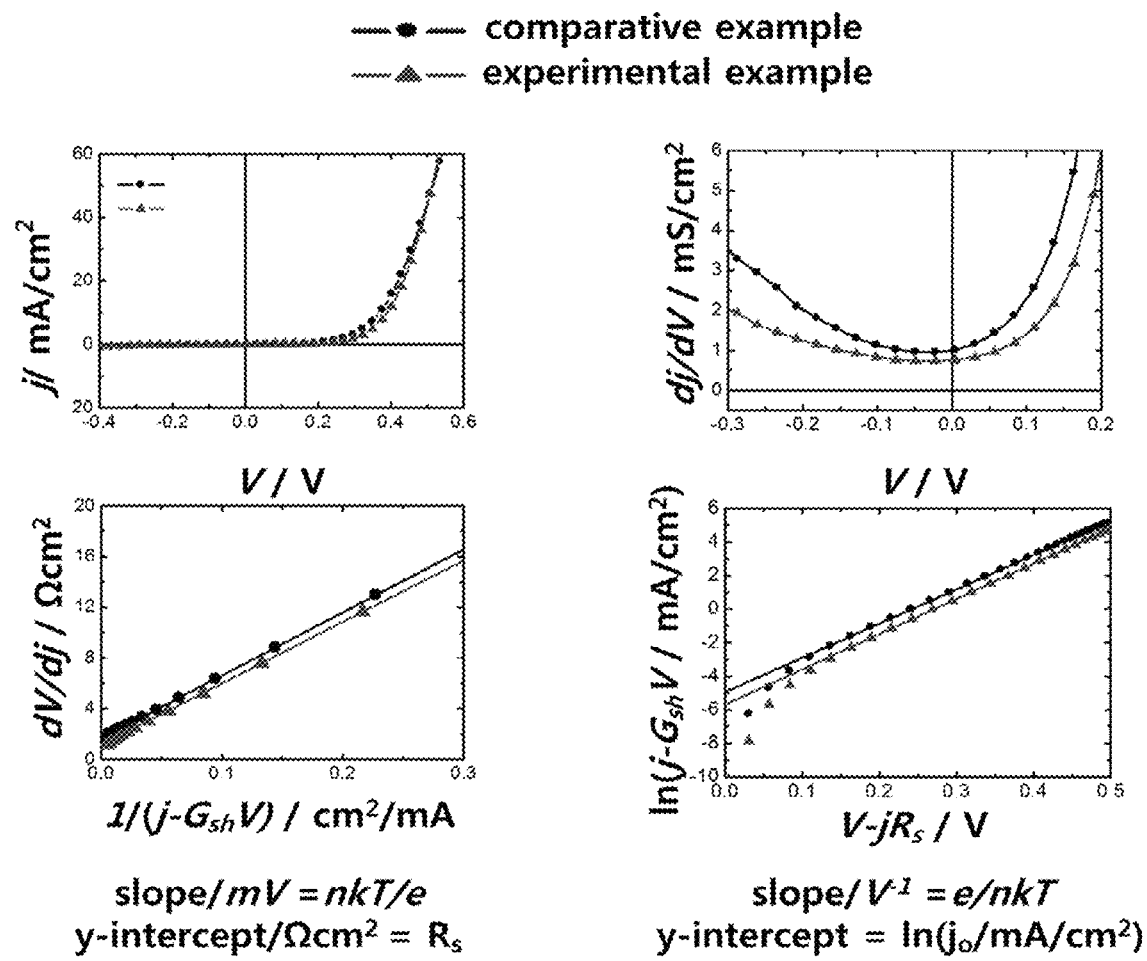
FIG. 14 is graphs showing the results of diode analysis for current-voltage curves of the solar cell devices manufactured according to the experimental example and the comparative example 2.

In order to analyze variations in photoelectric characteristic of the solar cell devices manufactured according to the experimental example and the comparative example 2, a diode analysis was performed on the current-voltage curves, and the results are shown in FIG. 14 and values thereof are shown in the following Table 1.

TABLE 1

| Device | $G_{sh}$/A/mS cm$^{-2}$ | $R_s$A/Ω cm$^2$ | n | $j_0$/mA/cm$^2$ |
|---|---|---|---|---|
| Comparative Example 2 | 0.99 ± 0.03 | 1.64 ± 0.01 | 1.92 ± 0.01 | (7.18 ± 0.09) × 10$^{-3}$ |
| Experimental Example | 0.77 ± 0.01 | 1.14 ± 0.01 | 1.87 ± 0.01 | (3.39 ± 0.05) × 10$^{-3}$ |

As shown in Table 1, it can be seen that, as compared to the solar cell manufactured according to the comparative example 2, shunt conductance of the solar cell device manufactured according to the experimental example was reduced from 0.99 mS/cm$^2$ to 0.77 mS/cm$^2$ and a reverse saturation current which is also referred to as a recombination current was reduced from 7.18×10$^{-3}$ mA/cm$^2$ to 3.39×10$^{-3}$ mA/cm$^2$. Therefore, it can be confirmed that a loss caused by shunt and recombination can be effectively reduced by applying the passivation film, which is formed at the lateral surface or the cut surface of the patterned back contact manufactured according to various embodiments, to the solar cell.

Trough the detailed description of the experimental example, it can be confirmed that problems of a shunt path formation and an increase in recombination loss on a lateral surface or a cut surface of a patterned back contact, which are caused by exposure of a lateral surface or a cut surface of an electrode (back contact) at which a specific pattern is patterned for implementing a light transmission type thin film solar cell, can be resolved by forming a passivation film.

Further, it was confirmed that the light transmission type thin film solar cell having almost no loss in light transmittance can be manufactured even when the recombination preventing film or the passivation film is formed on the lateral surface or the cut surface of the patterned back contact according to the experimental example.

Therefore, according to the various embodiments and the experimental example, it is possible to provide the light transmission type thin film solar cell which is characterized by high output while having light transmittance and aesthetic impression. Further, according to the various embodiments of the present invention, since the electrodeposition technique applicable at a room temperature and an atmospheric pressure is used to manufacture the light transmission type thin film solar cell, a manufacturing process of a thin film for a solar cell, which can reduce initial facility investment cost and process costs compared with a vacuum process and can be applicable to mass production, can be implemented.

As described above, the light transmission type thin film solar cell according to the various embodiments of the present invention is excellent in terms of stability while being characterized by high aesthetic impression, low cost, and a high output such that the light transmission type thin film solar cell can be applied to a high added value solar cell such as a building integrated photovoltaic (BIPV), a vehicle integrated photovoltaic (VIPV), or the like.

According to the present invention, unlike a process of forming a light absorption layer and then removing a portion of the light absorption layer, which is conventionally performed to manufacture a light transmission type thin film solar cell, it is possible to provide a compound thin film securing light transmittance simultaneously with a thin film synthesis using selective electrochemical deposition without removing a synthesized thin film.

Further, according to the present invention, a material loss occurring during a conventional process of removing a light absorption layer can be eliminated such that there is an advantage of being capable of maximizing use efficiency of a light absorption layer material.

Furthermore, according to the present invention, a problem of a shunt path formation caused by exposure of a lateral surface or a cut surface of an electrode patterned for implementing a light transmission type thin film solar cell, and a problem of an increase in recombination loss on the lateral surface or the cut surface of the patterned electrode can be resolved by forming an oxide-based passivation film through a solution process such that efficiency of the thin film solar cell can be increased.

Moreover, according to the present invention, even when the recombination preventing film or the passivation film is formed on the lateral surface or the cut surface of the patterned electrode, an oxide-based passivation material having high light transmittance is used such that a light transmission type thin film solar cell having no loss in light transmittance can be manufactured.

In addition, according to the present invention, a thin film solar cell having high efficiency (or high output) while having light transmittance (daylighting) and aesthetic impression can be provided.

Additionally, according to the present invention, since the electrodeposition technology applicable at a room temperature and an atmospheric pressure is used, a manufacturing process of a thin film solar cell, which can reduce initial facility investment cost and process costs, have use efficiency of a raw material, and easily be applied for large-area application to allow mass production, can be implemented.

Further, the light transmission type solar cell according to the present invention is excellent in terms of stability while being characterized by high daylighting, high aesthetic impression, low cost, and a high output such that the light transmission type solar cell can be applied to a high added value solar cell such as a BIPV, a VIPV, or the like.

Furthermore, according to the present invention, a light transmission type solar cell can be implemented in which a method of controlling light transmittance of the light absorption layer is simple, manufacturing productivity can be improved, and multistage strict process control is not required.

It should be understood that effects of the present invention are not limited to the above-described effects and include all effects which can be deduced from the configuration of the invention disclosed in the detailed description or in the appended claims.

The detailed description is intended to describe examples, and it will be apparent to those skilled in the art to which the present invention pertains that other specific forms may be easily made without departing from the technical spirit or essential featured of the present invention. Therefore, it should be understood that the above-described embodiments are not restrictive but illustrative in all aspects. The scope of the present invention is defined by the appended claims, and all alternations or modifications derived from the meaning and scope of the claims and their equivalents should be construed as being included within the scope of the present invention.

What is claimed is:

1. A method of manufacturing a compound thin film, comprising:
    configuring an electrodeposition circuit by connecting an electrolytic solution, which is manufactured by mixing a predetermined precursor with a solvent, and an electrochemical cell, which includes a working electrode in a form of an electrode at which a specific pattern is patterned on a predetermined substrate, to a voltage application device or a current application device; and
    applying a reduction voltage or current to the working electrode using the voltage application device or the current application device, and selectively electrodepositing a thin film in some region of the electrode along a shape of the electrode at which the specific pattern is patterned;
    wherein the specific pattern is a pattern formed by a plurality of hollows having different light transmittance areas.

2. The method of claim 1, further comprising, before the configuring of the electrodeposition circuit, manufacturing an electrode substrate on which the electrode at which the specific pattern is patterned is formed,
    wherein the manufacturing of the electrode substrate includes:
    forming the electrode on the predetermined substrate;
    forming the specific pattern using photolithography of forming a photoresist on the electrode;
    forming a passivation film in a predetermined region on the electrode; and
    removing the photoresist formed on the electrode.

3. The method of claim 1, further comprising, before the configuring of the electrodeposition circuit, manufacturing an electrode substrate on which the electrode at which the specific pattern is patterned is formed,
    wherein the manufacturing of the electrode substrate includes:
    forming the electrode on the predetermined substrate;
    forming the specific pattern on the electrode using a laser; and
    forming a passivation film in a predetermined region on the electrode.

4. The method of claim 1, further comprising performing heat treatment on the thin film formed in the forming of the thin film in a selenium or sulfur-containing gas atmosphere.

5. The method of claim 1, wherein the specific pattern is in a form of one or more circular or polygonal hollow-hole patterns.

6. The method of claim 1, wherein the predetermined substrate is formed of a soda-lime glass, and the electrode at which the specific pattern is patterned is formed of molybdenum (Mo).

7. The method of claim 2, wherein the predetermined region is a cut surface generated by patterning the specific pattern on a lateral surface of the electrode at which the specific pattern is patterned or on the electrode at which the specific pattern is patterned.

8. The method of claim 1, wherein the electrolytic solution is produced by dissolving one or more among potassium chloride, sulfamic acid, potassium hydrogenphthalate, selenium dioxide, copper chloride dehydrate, and indium chloride in distilled water to have a predetermined pH.

9. The method of claim 2, wherein:
- the passivation film is formed of one among an oxide, a nitride, and a sulfide made of one metal among nickel, tungsten, molybdenum, copper, titanium, zinc, tin, iron, chromium, aluminum, silicon, and magnesium, or an alloy of two or more among nickel, tungsten, molybdenum, copper, titanium, zinc, tin, iron, chromium, aluminum, silicon, and magnesium; and
- the forming of the passivation film in the predetermined region on the electrode is performed using a coating method including sputtering, thermal evaporation, e-beam evaporation, atomic layer deposition, spin coating, doctor blading, electro-spraying, or electrodeposition.

10. A compound thin film manufactured by the method of manufacturing a compound thin film according to claim 1.

11. A solar cell comprising the compound thin film according to claim 10.

12. The method of claim 1, wherein the pattern formed by the plurality of hollows having different light transmittance areas is a pattern formed by adjusting one or more of a diameter of each of the plurality of hollows and a separation distance between the plurality of hollows.

13. The method of claim 3, wherein the predetermined region is a cut surface generated by patterning the specific pattern on a lateral surface of the electrode at which the specific pattern is patterned or on the electrode at which the specific pattern is patterned.

14. The method of claim 3, wherein:
- the passivation film is formed of one among an oxide, a nitride, and a sulfide made of one metal among nickel, tungsten, molybdenum, copper, titanium, zinc, tin, iron, chromium, aluminum, silicon, and magnesium, or an alloy of two or more among nickel, tungsten, molybdenum, copper, titanium, zinc, tin, iron, chromium, aluminum, silicon, and magnesium; and
- the forming of the passivation film in the predetermined region on the electrode is performed using a coating method including sputtering, thermal evaporation, e-beam evaporation, atomic layer deposition, spin coating, doctor blading, electro-spraying, or electrodeposition.

* * * * *